(12) United States Patent
Shibutani (10) Patent No.: US 9,549,472 B2
(45) Date of Patent: Jan. 17, 2017

(54) PRINTED CIRCUIT BOARD, SEMICONDUCTOR DEVICE CONNECTION STRUCTURE, AND METHOD OF MANUFACTURING A PRINTED CIRCUIT BOARD

(71) Applicant: CANON KABUSHIKI KAISHA, Tokyo (JP)

(72) Inventor: Ryuichi Shibutani, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 125 days.

(21) Appl. No.: 14/305,948

(22) Filed: Jun. 16, 2014

(65) Prior Publication Data

US 2014/0376202 A1 Dec. 25, 2014

(30) Foreign Application Priority Data

Jun. 20, 2013 (JP) ................ 2013-129410

(51) Int. Cl.
*H05K 7/00* (2006.01)
*H05K 1/18* (2006.01)
(Continued)

(52) U.S. Cl.
CPC ....... *H05K 3/3436* (2013.01); *H01L 23/49811* (2013.01); *H01L 23/49827* (2013.01); *H01L 23/49833* (2013.01); *H05K 1/02* (2013.01); *H05K 1/112* (2013.01); *H05K 1/181* (2013.01); *H05K 1/186* (2013.01); *H01L 23/49894* (2013.01); *H01L 25/105* (2013.01); *H01L 2225/1058* (2013.01);
(Continued)

(58) Field of Classification Search
CPC .......... H05K 1/02; H05K 1/181; H05K 1/182; H05K 1/186; H05K 2201/10689; H05K 1/111; H05K 1/112; H05K 1/113; H05K 1/114; H05K 1/115; H05K 1/116; H05K 1/117; H05K 1/144; H05K 2201/041; H05K 2201/042; H01R 12/714
USPC ............... 361/748, 760, 761, 764, 767, 771, 783,361/784, 790, 803, 804; 257/678, 686, 690

See application file for complete search history.

(56) References Cited

U.S. PATENT DOCUMENTS 8,193,624 B1 * 6/2012 Sohn .................. H01L 21/563
257/684

FOREIGN PATENT DOCUMENTS

JP 2011-142185 A 7/2011

* cited by examiner

*Primary Examiner* — Binh Tran
(74) *Attorney, Agent, or Firm* — Fitzpatrick, Cella, Harper & Scinto (57) ABSTRACT

First electrode pads formed on one semiconductor package surface include a first reinforcing electrode pad having a surface area larger than that of other first electrode pads. Second electrode pads formed on a printed wiring board on which the semiconductor package is mounted include at least one second reinforcing electrode pad. The second reinforcing electrode pad opposes the first reinforcing electrode pad, and has a surface area greater than that of the other second electrode pads. The first and second electrode pads are connected by solder connection parts. A cylindrical enclosing member encloses an outer perimeter of a solder connection part connecting the first and second reinforcing electrode pads. Increases in the amount of warping of semiconductor devices such as the package substrate and the printed wiring board are suppressed, and the development of solder bridges with respect to adjacent solder connecting parts or adjacent components is reduced.

10 Claims, 11 Drawing Sheets

(51) Int. Cl.
*H05K 3/34* (2006.01)
*H05K 1/02* (2006.01)
*H05K 1/11* (2006.01)
*H01L 23/498* (2006.01)
*H01L 25/10* (2006.01)

(52) U.S. Cl.
CPC ............ *H01L 2924/1432* (2013.01); *H01L 2924/15311* (2013.01); *H01L 2924/3511* (2013.01); *H05K 1/0271* (2013.01); *H05K 2201/10242* (2013.01); *H05K 2201/10257* (2013.01); *H05K 2201/2036* (2013.01); *Y02P 70/613* (2015.11)

PRINTED CIRCUIT BOARD, SEMICONDUCTOR DEVICE CONNECTION STRUCTURE, AND METHOD OF MANUFACTURING A PRINTED CIRCUIT BOARD

BACKGROUND OF THE INVENTION

1. Field of the Invention

The present invention relates to a printed circuit board on which two mutually opposing electrode pads are connected by a solder connection part, a semiconductor device connection structure, and a method of manufacturing a printed circuit board.

2. Description of the Related Art

In recent years, there has been a constant need for lighter, more compact, and multi-functional digital electronic devices such as digital still cameras and digital video cameras. In order to fulfill that need, it is necessary to achieve advances in making electronic components within the electronic devices lighter, more compact, and multi-functional, and to mount the electronic components at a high density on a printed wiring board. Ball grid arrays (BGAs) and chip size packages (CSPs), which are capable of arranging connection electrodes at a high density, are often used as mounting techniques in order to realize these demands. Further, in order to address the demand for additional size reductions, land grid array (LGA) semiconductor packages have been employed for connection to connection electrode parts by using solder pastes instead of solder bumps.

With LGA semiconductor packages, a volume of an individual solder connection part used for connection is smaller than that when using BGA semiconductor packages. Further, the height between the semiconductor package and a printed circuit board after connection is small (on the order of 100 μm to 200 μm). Solder pastes thus easily spread out into their surroundings when softened by reflow heating, allowing solder bridges to form with respect to adjacent terminals and adjacent components.

In Japanese Patent Application Laid-Open No. 2011-142185, there is disclosed a flip chip semiconductor device where barriers are formed for solder connection parts of a package substrate in order to prevent solder bridges.

Warping may develop in semiconductor packages and printed circuit boards during solder heating and melting due to differences in their coefficients of thermal expansion. However, with the structure disclosed by Japanese Patent Application Laid-Open No. 2011-142185, barriers having the same height are formed between all of adjacent solder connection parts of the semiconductor device. The connection reliability of solder connection parts in regions where a gap between the semiconductor package and the printed circuit board increases due to warping is thus significantly reduced. That is, although melted solder normally is capable of suppressing stress due to warping, with the structure of Japanese Patent Application Laid-Open No. 2011-142185, the barriers between the solder connection parts inhibit this process.

Further, with the structure of Japanese Patent Application Laid-Open No. 2011-142185, barriers are only formed between respective electrode pads of the semiconductor device, while barriers are not formed in perimeter portions of the semiconductor device. Accordingly, when solder pastes soften due to reflow heating, the solder pastes flow out to the perimeter portions of the semiconductor device. This leads to problems where the solder pastes may detach, may form solder balls and splash out, and may lead to solder bridging with respect to other adjacent components.

SUMMARY OF THE INVENTION

An object of the present invention is to provide a printed circuit board, a semiconductor device connection structure, and a method of manufacturing a printed circuit board where increases in the amount of warping of semiconductor devices such as a package substrate and a printed circuit board are suppressed, thereby mitigating warping in the suppressed regions, and reducing the occurrence of solder bridges with respect to adjacent solder connection parts and adjacent components.

According to one embodiment of the present invention, there is provided a printed circuit board, including: a semiconductor package having: a package substrate having a plurality of first electrode pads arranged on one surface of the semiconductor package, the plurality of first electrode pads includes at least one first reinforcing electrode pad having a surface area larger than a surface area of each of the other first electrode pads; and a semiconductor element mounted on the package substrate; a printed wiring board having a plurality of second electrode pads that is arranged opposing each of the first electrode pads, the semiconductor package is mounted on the printed wiring board and the plurality of second electrode pads includes at least one second reinforcing electrode pad being disposed in a location opposing the at least one first reinforcing electrode pad and having a surface area larger than a surface area of each of other second electrode pads; a plurality of solder connection parts being configured to connect the plurality of first electrode pads and the plurality of second electrode pads; the plurality of solder connection parts includes a plurality of first solder connection parts and a second solder connection part being configured to connect the at least one first reinforcing electrode pad and the at least one second reinforcing electrode pad; and a cylindrical enclosing member being configured to enclose an outer perimeter of the second solder connection part.

Further features of the present invention will become apparent from the following description of exemplary embodiments with reference to the attached drawings.

DESCRIPTION OF THE EMBODIMENTS

Exemplary embodiments of the present invention are described below in detail with reference to the drawings.

First Embodiment

Figure 1:
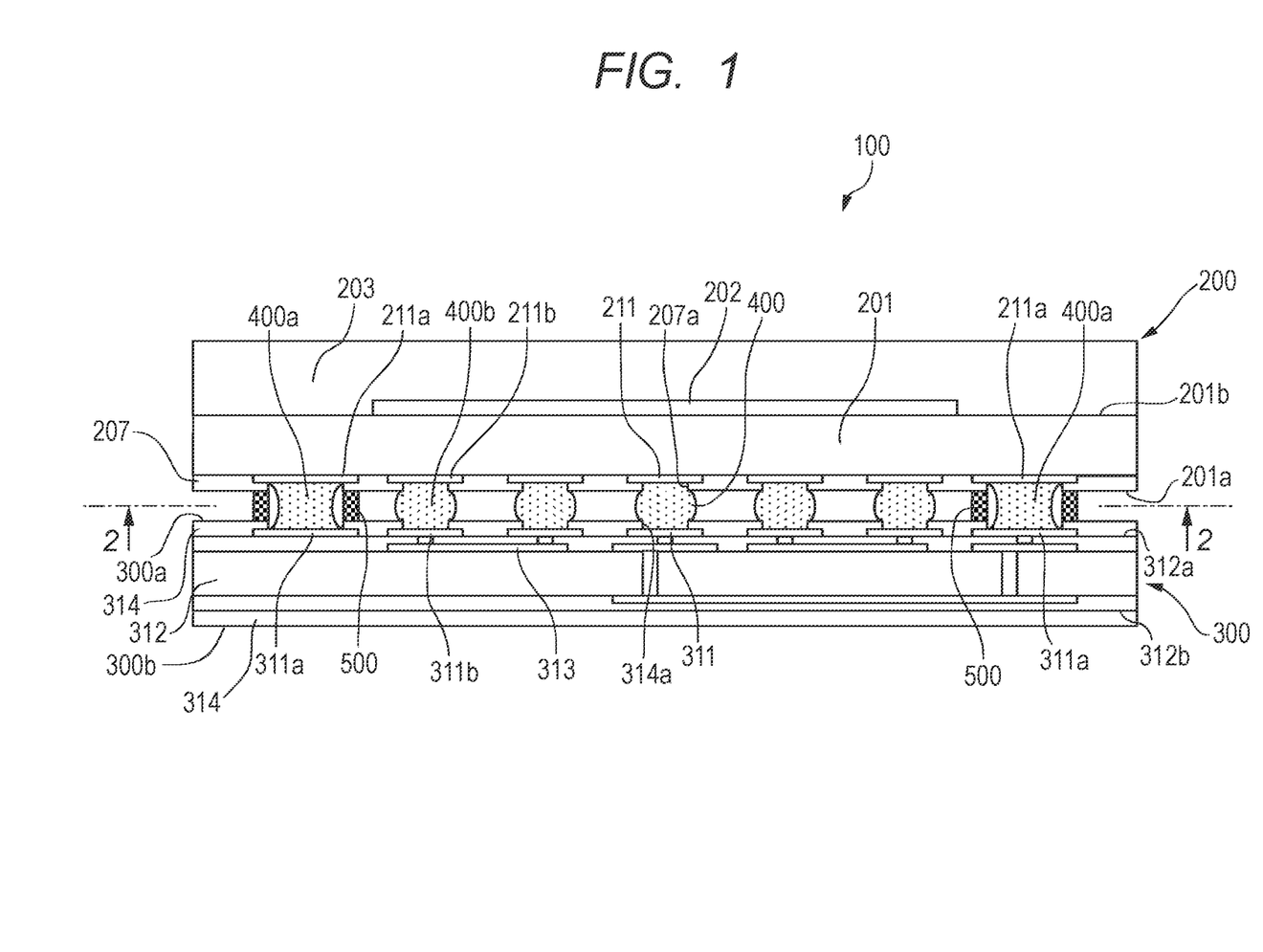
FIG. 1 is an explanatory diagram illustrating a schematic configuration of a printed circuit board according to a first embodiment of the present invention.

FIG. 1 is an explanatory diagram illustrating a schematic configuration of a printed circuit board according to a first embodiment of the present invention. A printed circuit board 100, which is an electronic device, includes a semiconductor package 200, which is an electronic component. The semiconductor package 200 includes a package substrate (interposer) 201, which is a first semiconductor device, and a semiconductor element 202 such as a semiconductor chip (die) mounted on the package substrate 201. The package substrate 201 forms an approximate rectangular shape from a planar view.

Further, the printed circuit board 100 includes a printed wiring board 300, which is a second semiconductor device, and a plurality of solder connection parts 400. In addition, in the first embodiment, the printed circuit board 100 includes an enclosing member 500 that encloses a side surface of, from among the plurality of solder connection parts 400, each solder connection part 400a at four corner portions of the package substrate 201.

The semiconductor package 200 may be, for example, a sensor package such as a CCD imaging sensor or a CMOS imaging sensor, a memory package, a CPU package, or the like. In the first embodiment, the semiconductor package 200 is a land grid array (LGA) semiconductor package.

The package substrate 201 includes a plurality of electrode pads (first electrode pads) 211 arranged in an array on a surface 201a as a one surface of the package substrate 201. The semiconductor element 202 is mounted to a surface 201b as another surface of the package substrate 201, and is sealed by a sealing resin 203.

The package substrate 201 includes a solder resist 207 formed on the surface 201a. Each electrode pad 211 is exposed to an outside portion through each opening 207a formed in the solder resist 207.

The package substrate 201 is a multilayered structure having a conducting layer and an insulating layer, and may be, for example, a glass epoxy substrate using glass epoxy as an organic insulator in the insulating layer. Note that, an inorganic substrate such as a ceramic substrate, a glass substrate, or a Si substrate may also be used as the package substrate 201. Further, components such as integrated circuits, resistors, capacitors, and the like may also be mounted on the package substrate 201 in addition to the semiconductor element 202.

Copper, for example, may be used as the electrode pad 211 material. Further, the electrode pads 211 may also be formed from a multi-layer metallic material such as nickel and gold, or nickel, palladium, and gold.

The solder resist 207 may employ a structure where the diameter of the openings 207a is smaller than the diameter of the electrode pads 211, which is known as a solder mask defined (SMD) structure. Further, the solder resist 207 may employ a structure where the diameter of the openings 207a is larger than the diameter of the electrode pads 211, which is known as a non-solder mask defined (NSMD) structure.

The printed wiring board 300 is a multilayered structure having a conducting layer and an insulating layer, and a four layer structure having four conducting layers is used in the first embodiment. A base material portion 312 constituting an insulating layer may be, for example, a glass epoxy substrate that uses glass epoxy as an organic insulator. Note that, an inorganic substrate such as a ceramic substrate, a glass substrate, or a Si substrate may also be used as the base material portion 312. Further, electronic components such as other semiconductor packages, resistors, capacitors, and the like may also be mounted on the printed wiring board 300 in addition to the semiconductor package 200.

The printed wiring board 300 includes a plurality of electrode pads (second electrode pads) 311 arranged in an array on a surface 300a opposing the surface 201a of the package substrate 201. The number of the electrode pads 311 is the same as the number of the electrode pads 211 of the package substrate 201, and the electrode pads 311 are arranged in locations opposing the electrode pads 211.

Copper, for example, may be used as the electrode pad 311 material. Further, the electrode pads 311 may also be formed from a multi-layer metallic material such as nickel and gold, or nickel, palladium, and gold.

In addition to the electrode pads 311 and the base material portion 312, the printed wiring board 300 includes a wiring portion 313 and a solder resist 314.

The wiring portion 313 is formed across a surface 312a as a one surface of the base material portion 312 (a surface opposing the semiconductor package 200) and a surface 312b as another surface of the base material portion 312 (a surface not opposing the semiconductor package 200). Copper, for example, may be used as the wiring portion 313 material.

The solder resist 314 is formed over each of the surfaces 312a and 312b of the base material portion 312, and constitutes surfaces 300a and 300b of the printed wiring board 300. Openings 314a are formed in the solder resist 314 at positions corresponding to the respective electrode pads 311, thus exposing each of the electrode pads 311 to an outside portion through each opening 314a.

The solder resist 314 may employ a structure where the diameter of the openings 314a is smaller than the diameter of the electrode pads 311, which is known as a solder mask defined (SMD) structure. Further, the solder resist 314 may employ a structure where the diameter of the openings 314a is larger than the diameter of the electrode pads 311, which is known as a non-solder mask defined (NSMD) structure.

Each electrode pad 211 of the package substrate 201 is connected to each electrode pad 311 of the printed wiring board 300 by the solder connection part 400 made from solder. The electrode pads 211 and the electrode pads 311 are thus electrically and mechanically connected.

The solder connection parts 400 are formed by melting and solidifying solder paste. The solder paste material to be used may be obtained by mixing an alloy containing tin and at least one of metals such as silver, copper, and bismuth with a flux (reducing agent) into a paste state.

In the first embodiment, the plurality of electrode pads 211 of the package substrate 201 includes reinforcing electrode pads 211a (first reinforcing electrode pads) formed in four corner portions in the outermost perimeter, and electrode pads 211b formed in locations other than those of the reinforcing electrode pads 211a. The reinforcing electrode pads 211a are formed as reinforcements, and the surface area of the reinforcing electrode pads 211a is larger than the surface area of the electrode pads 211b.

Further, the plurality of electrode pads 311 of the printed wiring board 300 includes reinforcing electrode pads 311a (second reinforcing electrode pads) formed in four corner portions in the outermost perimeter, and electrode pads 311b formed in locations other than those of the reinforcing electrode pads 311a. The reinforcing electrode pads 311a are formed as reinforcements, and the surface area of the reinforcing electrode pads 311a is larger than the surface area of the electrode pads 311b.

Note that, the reinforcing electrode pads 211a and the reinforcing electrode pads 311a may be electrode pads that are not connected to wirings or the like, and thus not electrically functional, or may be functional electrode pads connected to an electric power source or to ground.

The reinforcing electrode pads 211a and the reinforcing electrode pads 311a are arranged in mutually opposing locations. The electrode pads 211b and the electrode pads 311b are also arranged in mutually opposing locations.

Figure 2:
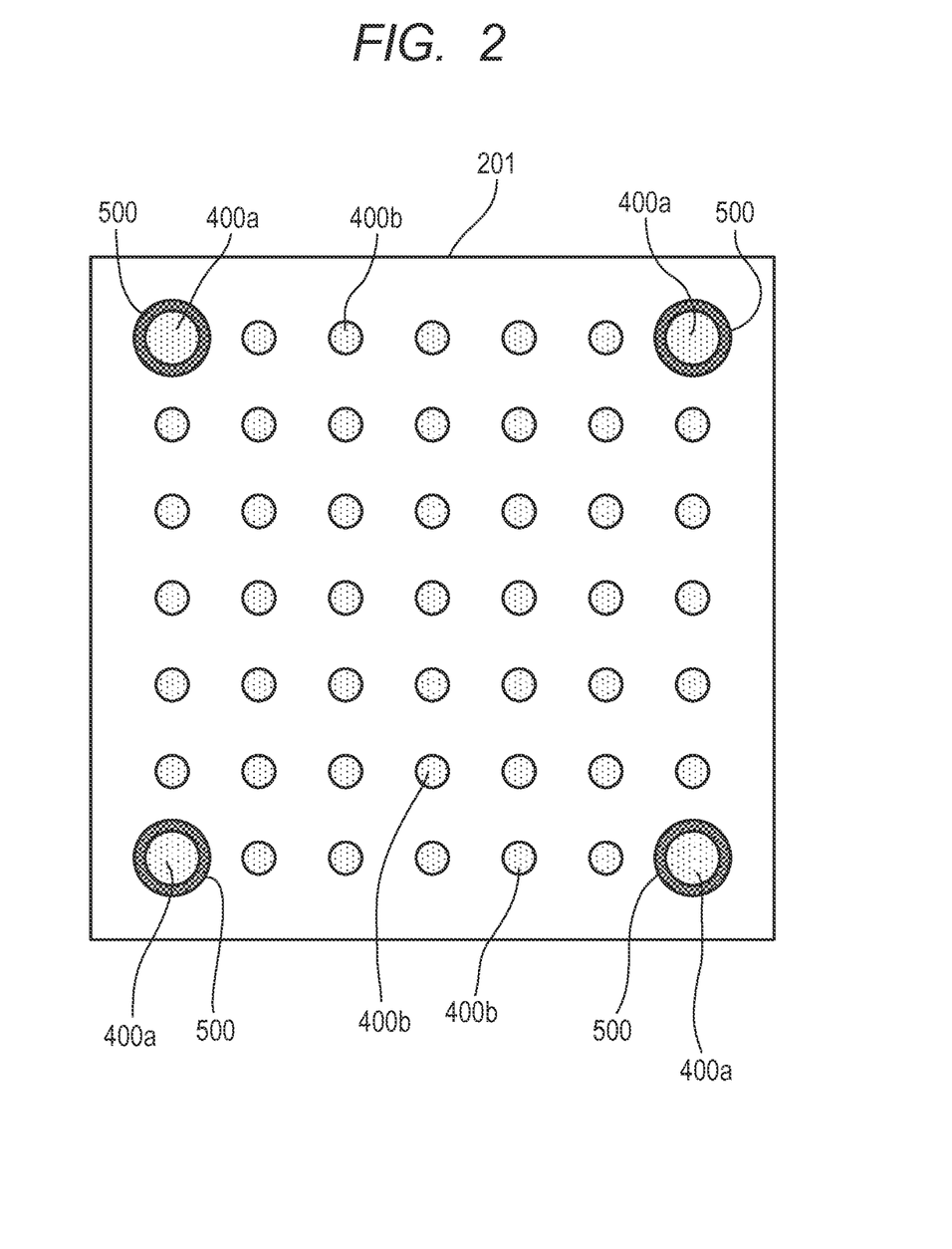
FIG. 2 is a cross sectional diagram of the printed circuit board taken along the plane 2-2 of FIG. 1.

FIG. 2 is a cross sectional diagram of the printed circuit board 100 taken along the 2-2 plane of FIG. 1. Note that, the 2-2 plane is a cross section parallel with the surface 201a or 300a of the package substrate 201 or the printed wiring board 300.

The plurality of solder connection parts 400 includes at least one solder connection part (second solder connection part) 400a that connects the reinforcing electrode pad 211a and the reinforcing electrode pad 311a. Further, the plurality of solder connection parts 400 includes a plurality of solder connection parts (first solder connection parts) 400b that connects the electrode pads 211b and the electrode pads 311b.

The electrode pads 211 and the electrode pads 311 are arranged in matrix in FIG. 1. The solder connecting parts 400 that connect the electrode pads 211 and the electrode pads 311 are also arranged in matrix.

The solder connection part 400a is located in the outermost perimeter of the plurality of solder connection parts 400. In the first embodiment, the solder connection parts 400a are located at the four corner portions of the package substrate 201. The solder connection part 400a is a reinforcing solder connection part formed to have a cross sectional surface area in a cross section along the 2-2 plane larger than the surface area of the solder connection parts 400b. That is, the volume of the reinforcing solder connection part 400a is larger than the volume of the other solder connection parts 400b. Relative warping due to differences in the coefficient of thermal expansion between the semiconductor package 200 and the printed wiring board 300 is thus controlled, and reductions in the reliability of the connection between the semiconductor package 200 and the printed wiring board 300 are suppressed.

In the first embodiment, four enclosing members 500 corresponding to respective solder connection parts 400a are disposed. The enclosing members 500 are formed in a cylindrical shape to enclose side surfaces of the solder connection parts 400a. At this point, the enclosing members 500 need not contact the solder connection parts 400a. The enclosing members 500 are formed only for the reinforcing solder connection parts 400a located in the outermost perimeter of the package substrate 201, and are not formed for the solder connection parts 400b. By not forming the enclosing members for the solder connection parts 400b, relative warping between the semiconductor package 200 and the printed wiring board 300, which cannot be suppressed only through the reinforcing solder connection parts 400a, can be relieved by the solder connection parts 400b.

Further, it is preferred that the enclosing members not be directly fixed to the package substrate and to the printed wiring board. It thus becomes possible to flexibly cope with relative warping between the semiconductor package 200 and the printed wiring board 300 by not employing a directly fixed connection.

Figure 3A:
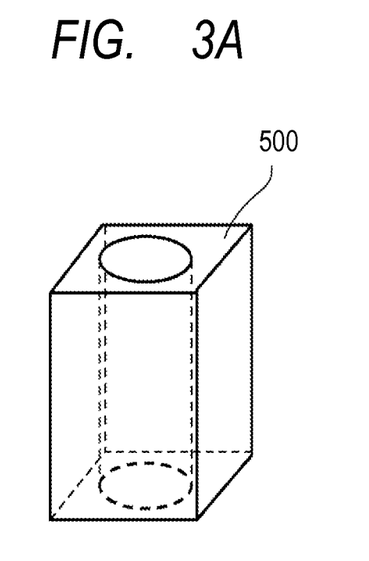
FIG. 3A is a schematic diagram illustrating another example of an enclosing member.
Figure 3B:
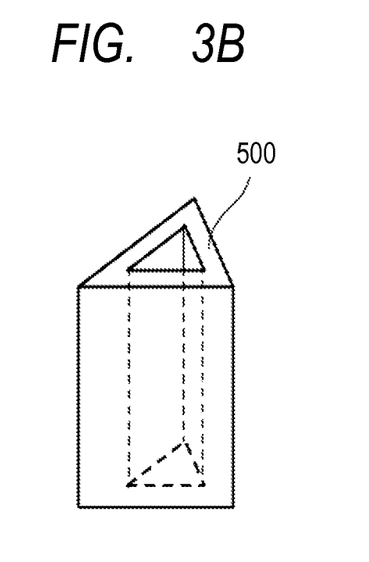
FIG. 3B is a schematic diagram illustrating yet another example of the enclosing member.

Note that, while the enclosing members 500 formed into a cylindrical shape are illustrated in FIG. 1, the exterior shape of the enclosing members is not limited to this shape. The enclosing members 500 may also be formed to have any shape, such as a polygonal prism shape including a quadrilateral prism shape illustrated in FIG. 3A and a triangular prism shape illustrated in FIG. 3B. Further, the shape of an inner surface (inside opening portion) of the enclosing member 500 may be formed to have any shape, such as a cylindrical shape or a polygonal prism shape, provided that the reinforcing electrode pad 211a and the reinforcing electrode pad 311a located in the solder connection part 400a are enclosed. Further, the enclosing member 500 may also be formed with a flange for ease of adsorption, and ease of handling using tweezers or the like.

The enclosing member 500 may be made using a material having a melting point higher than that of solder paste (solder). For example, the enclosing member 500 may be made using a material having superior heat tolerance and strength, such as stainless steel, ceramic, polyimide, or quartz glass.

The enclosing member 500 is formed so that the capacity of an opening portion of the enclosing member 500 is equal to or greater than the volume of the alloy constituent of the solder paste used when forming the solder connection part 400a, and equal to or less than the total volume of the flux constituent and the alloy constituent of the solder paste. The alloy constituent within the solder paste can thus be contained within the opening portion of the enclosing member 500.

Hereinafter, manufacturing steps for a method of manufacturing the printed circuit board 100 according to the first embodiment are described. FIG. 4A, FIG. 4B, FIG. 4C and FIG. 4D are schematic explanatory diagrams each illustrating manufacturing steps for manufacturing the printed circuit board 100 according to the first embodiment of the present invention.

Figure 4A:
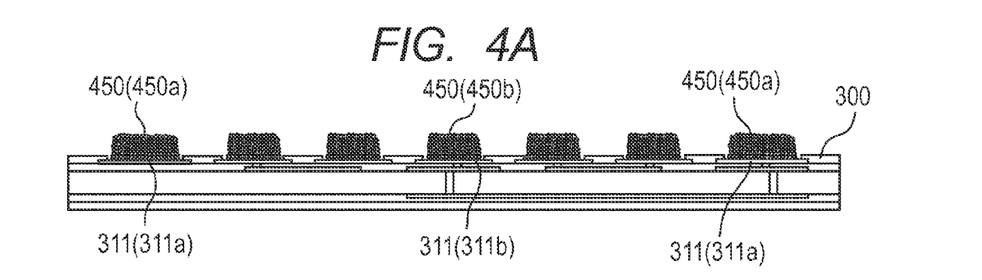
FIG. 4A is a schematic explanatory diagram illustrating each manufacturing step for manufacturing the printed circuit board according to the first embodiment.

First, as FIG. 4A illustrates, solder paste 450 is supplied (applied) to each of the electrode pads 311 of the printed wiring board 300 by screen printing.

Figure 4B:
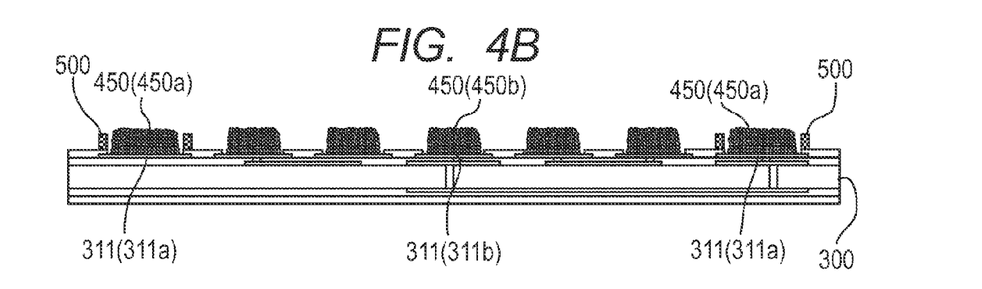
FIG. 4B is a schematic explanatory diagram illustrating each manufacturing step for manufacturing the printed circuit board according to the first embodiment.

Next, as FIG. 4B illustrates, cylindrical enclosing members 500 are disposed at locations to enclose, from among electrode pads out of the plurality of electrode pads 311 located at the outermost perimeter, the reinforcing electrode pads 311a whose surface area is larger than that of the electrode pads located inside the outermost perimeter. In the first embodiment, the enclosing members 500 are disposed at locations to surround the perimeter of solder pastes 450a at the locations of the reinforcing electrode pads 311a used for reinforcement. At this point, it is preferred that the enclosing members 500 not be in a fixed state with respect to the printed wiring board 300. The enclosing members 500 are formed to have a height less than that of the solder pastes 450.

Figure 4C:
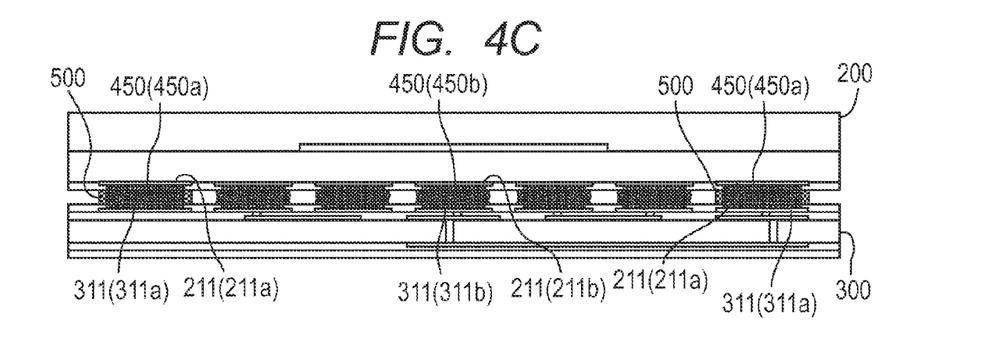
FIG. 4C is a schematic explanatory diagram illustrating each manufacturing step for manufacturing the printed circuit board according to the first embodiment.

Next, as FIG. 4C illustrates, the semiconductor package 200 is mounted on the printed wiring board so that each of the electrode pads 211 opposes each electrode pad 311 of the printed wiring board 300. At this point, the height of the solder pastes 450 is higher than that of the enclosing members 500, and therefore the respective electrode pads 211 of the semiconductor package 200 are able to contact the solder pastes 450.

Figure 4D:
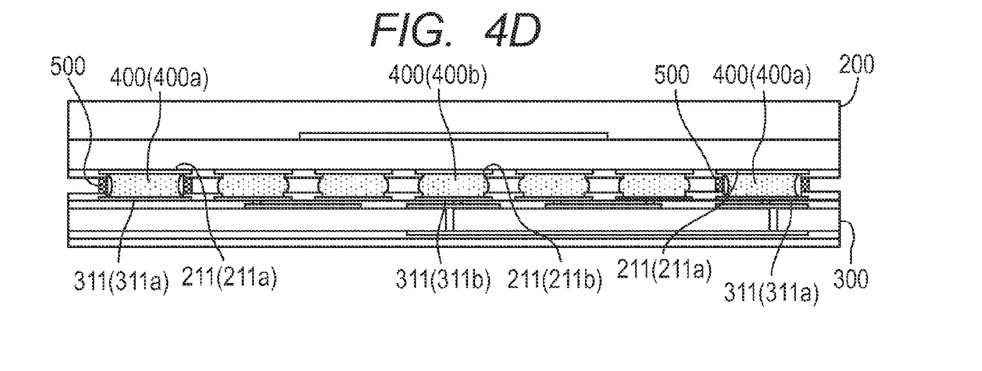
FIG. 4D is a schematic explanatory diagram illustrating each manufacturing step for manufacturing the printed circuit board according to the first embodiment.

Next, as FIG. 4D illustrates, the printed wiring board 300 and the semiconductor package 200 are heated to a temperature equal to or higher than the melting point of the solder pastes 450 using a reflow furnace, and then cooled to room temperature after the solder pastes 450 have melted. Methods such as spot heating may also be used as the heating method provided that the solder pastes 450 may be heated to a temperature equal to or higher than their melting point. That is, heating of the solder pastes 450 may be performed to a temperature equal to or higher than the melting point of the solder pastes 450, and lower than the melting point of the enclosing members 500.

Among these steps, when heating the printed wiring board 300 and the semiconductor package 200 by using a reflow furnace, the alloy spreads out to the surrounding area when the flux constituent in the solder pastes 450 is softened and flows out due to heating. In particular, in order to suppress reductions in connection reliability of the semiconductor package 200, from among the solder pastes 450, the solder pastes 450a are given a larger volume than other solder pastes 450b. The amount of alloy that spreads in the surrounding area is thus greater for the solder pastes 450a. That is, assuming that the enclosing members 500 are not present, bridges may be formed with respect to adjacent terminals (solder connection portions adjacent to the solder connection parts 400a) or adjacent components.

According to the first embodiment, the enclosing members 500 are present surrounding the solder pastes 450a. The enclosing members 500 have a volume equal to or greater than the alloy constituent volume of the solder pastes 450a, and equal to or less than the total of the flux constituent and the alloy constituent of the solder pastes 450a. The alloy constituent within the solder pastes 450a can thus be kept within the enclosing member 500, and spreading of the alloy within the solder pastes 450a during reflow heating can therefore be suppressed. Further, the enclosing members 500 are formed from independent structural components not fixed to either the printed wiring board 300 or the semiconductor package 200. That is, the enclosing members 500 are formed using separate members from the package substrate 201 and the printed wiring board 300. The enclosing members 500 are separate members from the package substrate 201 and the printed wiring board 300, and therefore the enclosing members 500 do not influence warping of the package substrate 201 or the printed wiring board 300. Therefore, the development of solder bridges with respect to adjacent elements and adjacent components can be reduced without increasing the likelihood of solder non-connections (open circuit failures).

In addition, the enclosing members 500 are not formed integrally with the surface 300a of the printed wiring board 300. Therefore, when screen printing the solder pastes 450, a gap does not develop between the printing plate and the printed wiring board 300, and the solder pastes do not ooze out. Narrow pitch printing can thus be attained.

That is, according to the first embodiment, the flow out of the solder forming the large cross sectional area solder connection parts 400a when being softened during heating can be suppressed by the enclosing members 500. The development of solder bridges with respect to adjacent solder connecting parts 400a and other adjacent components is therefore reduced. In addition, the enclosing members 500 are structural components independent of the package substrate 201 and the printed wiring board 300, and therefore the development of solder non-connections (open circuit failures) can be reduced without increasing warping of the package substrate 201 or the printed wiring board 300.

A high density arrangement with a very narrow gap between the semiconductor package 200 and an electronic component (not shown) therefore becomes possible. It also becomes possible to miniaturize the printed circuit board 100, and by extension, it becomes possible to miniaturize electronic equipment that includes the printed circuit board 100.

Further, the enclosing members 500 are mounted after printing of the solder pastes 450, and narrow pitch printing therefore becomes possible without causing oozing of the solder pastes 450. It thus becomes possible to form the solder connection parts 400 at a high density, and it also becomes possible to miniaturize the semiconductor package 200. Further, high functionality becomes possible due to an increase in the number of pins used.

Second Embodiment

Hereinafter, a printed circuit board according to a second embodiment of the present invention is described. In the first embodiment above, a case is described where the volume of the solder connection parts 400a, which are the second solder connection parts in the four corner portions, is larger than the volume of the other solder connections parts 400b, which are the first solder connection parts, and where the enclosing members 500 are present to enclose the solder connection parts 400a. The second solder connection parts may also be disposed at locations in the outermost perimeter other than corner position in addition to the four corner portions. Note that, in the second embodiment, structures similar to those of the first embodiment use the same reference symbols, and descriptions thereof are omitted.

Figure 5:
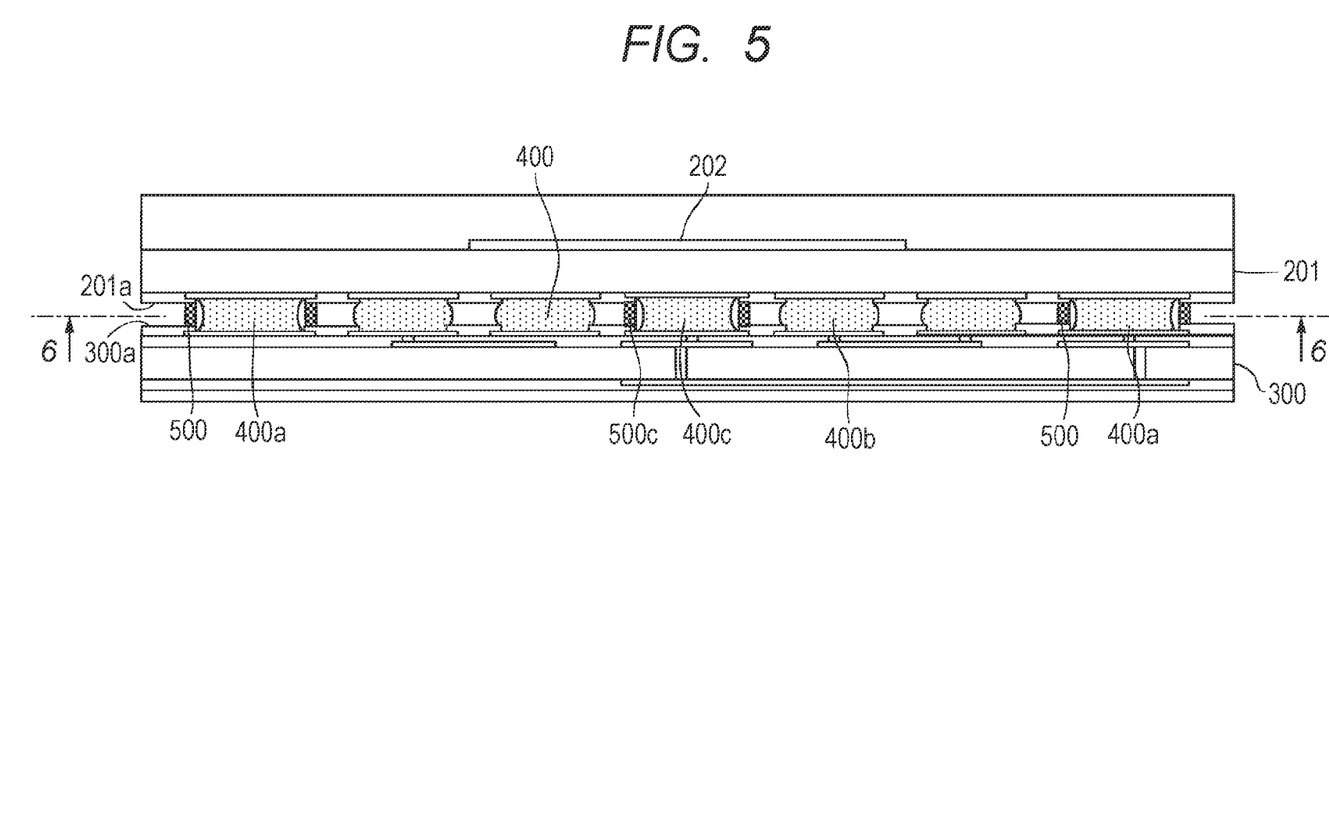
FIG. 5 is a schematic cross sectional diagram illustrating a schematic configuration of a printed circuit board according to a second embodiment of the present invention.
Figure 6:
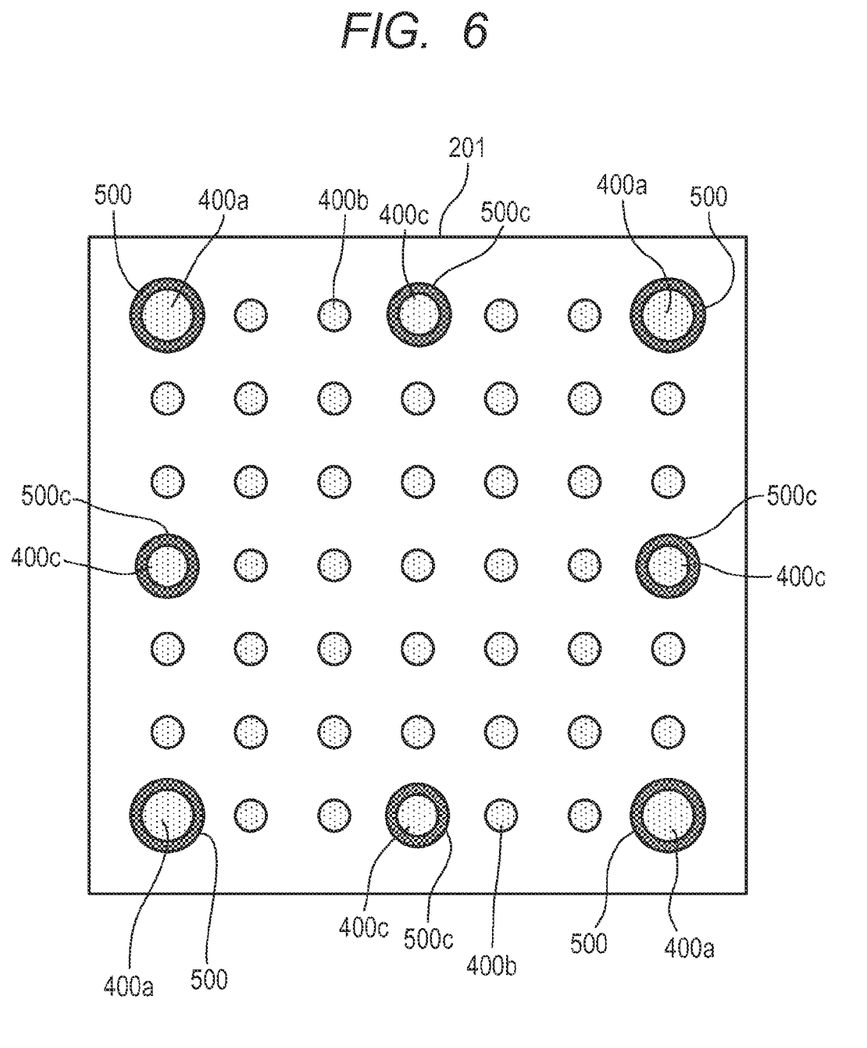
FIG. 6 is a cross sectional diagram of the printed circuit board taken along the 6-6 plane of FIG. 5.

FIG. 5 is a schematic cross sectional diagram illustrating a schematic configuration of a printed circuit board according to a second embodiment of the present invention. FIG. 6 is a cross sectional diagram of the printed circuit board taken along the 6-6 plane of FIG. 5. Note that, the 6-6 plane is a cross section parallel with the surface 201a or 300a of the package substrate 201 or the printed wiring board 300.

As outermost perimeter second solder connection parts, the plurality of solder connection parts 400 includes the solder connection parts 400a disposed at the four corner portions of the package substrate 201, and solder connection parts 400c disposed at locations other than the corner portions. Other than the solder connection parts 400a and 400c, the plurality of solder connection parts 400 includes the solder connection parts 400b. One or more of the solder connection parts 400c may be present.

The solder connection parts 400a and 400c have a cross sectional area (volume) larger than that of the solder connection parts 400b. The solder connection parts 400a are formed to have a volume equal to or greater than the volume of the solder connection parts 400c.

The solder connection parts 400a are enclosed by the cylindrical enclosing members 500, similarly to the first embodiment. In addition, in the second embodiment, the solder connection parts 400c are enclosed by cylindrical enclosing members 500c. At this point, the solder connection parts 400c and the enclosing members 500c may be in contact, or may not be in contact.

The enclosing members 500 and 500c may be made using a material having a melting point higher than that of solder paste. For example, the enclosing members 500 and 500c may be made using a material having superior heat tolerance and strength, such as stainless steel, ceramic, polyimide, or quartz glass.

The enclosing members 500 and 500c are formed so that the capacity of opening portions of the enclosing members 500 and 500c is equal to or greater than the volume of the alloy constituent of the solder paste formed on the solder connection parts 400a and 400c, and equal to or less than the total volume of the flux constituent and the alloy constituent of the solder paste. The alloy constituent within the solder paste can thus be contained within the opening portions of the enclosing members 500 and 500c.

As FIG. 6 illustrates, the solder connection parts 400c can be formed, for example, in center portions of respective sides. There are no limitations on the location, however, and the solder connection parts 400c can also be formed in other outermost perimeter locations, provided that the locations are not at the four corner portions.

According to the second embodiment described above, in addition to at least one solder connection parts 400a present at the four corner portions among the solder connection parts 400, at least one solder connection part 400c formed in a location on the outermost perimeter other than at the four corner portions is also included as large volume solder connection parts. Further, the enclosing members 500 are present at locations where the solder connection parts 400a exist, and the enclosing members 500c are also present at locations where the solder connection parts 400c exist. The development of solder bridges with respect to adjacent terminals (solder connection parts adjacent to the solder connection parts 400a and 400c) and with respect to adjacent components can thus be reduced. In addition, the development of fractures in the solder connection parts caused by large warping that is accompanied by lower solder connection part height can be reduced.

Third Embodiment

Figure 7:
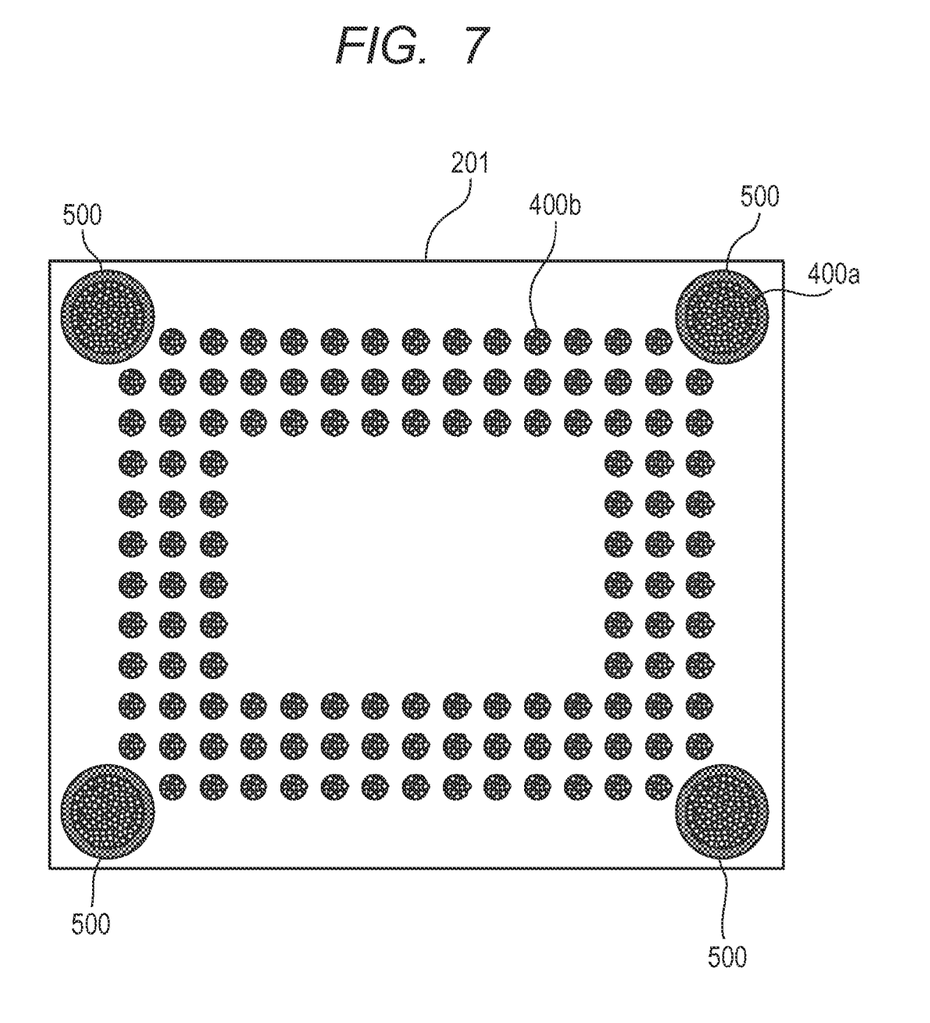
FIG. 7 is a schematic cross sectional diagram illustrating a schematic configuration of a printed circuit board according to a third embodiment of the present invention.

Hereinafter, a printed circuit board according to a third embodiment of the present invention is described. In the first embodiment and the second embodiment, the reinforcing electrode pads 211a, from among the electrode pads 211 disposed in matrix, are formed in the outermost perimeter. Further, the reinforcing electrode pads 311a, from among the electrode pads 311 disposed in matrix, are formed in the outermost perimeter. Further, the second solder connection parts 400a, from among the solder connection parts 400 disposed in matrix, are formed in the outermost perimeter. In the third embodiment, as FIG. 7 illustrates, the electrode pads 211b are formed in a peripheral state, and the reinforcing electrode pads 211a are formed further out in the outermost perimeter of the electrode pads 211b in the peripheral state. The reinforcing electrode pads 211a are formed in the four corner portions of the semiconductor package 200. By forming the reinforcing electrode pads 211a even further out in the outermost perimeter of the electrode pads 211b in the peripheral state, warping of the semiconductor package 200 can be effectively suppressed.

Fourth Embodiment

Figure 8A:
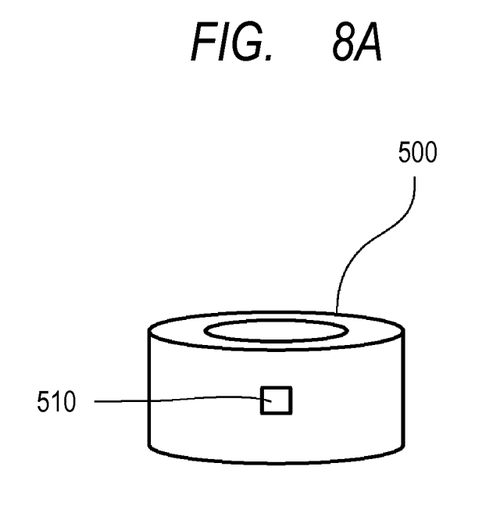
FIG. 8A is a schematic perspective diagram illustrating a shape of an enclosing member of a printed circuit board according to a fourth embodiment of the present invention.
Figure 8B:
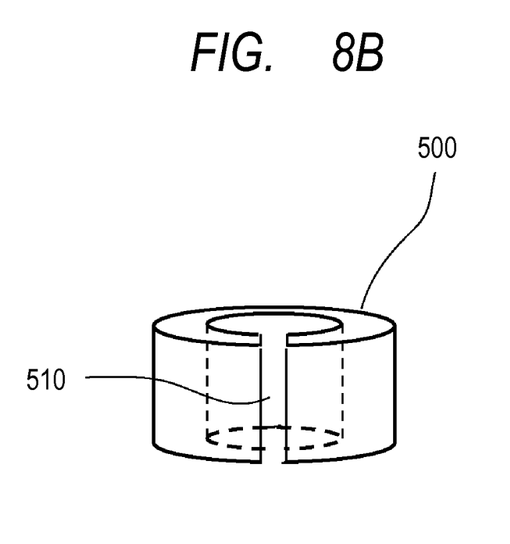
FIG. 8B is a schematic perspective diagram illustrating a shape of the enclosing member of the printed circuit board according to the fourth embodiment.

Hereinafter, an enclosing member of a printed circuit board according to a fourth embodiment of the present invention is described. FIG. 8A and FIG. 8B are schematic perspective diagrams illustrating a shape of the enclosing member of the printed circuit board according to the fourth embodiment of the present invention. FIG. 8A is a schematic perspective diagram illustrating an enclosing member in which a window opening is formed on a side surface thereof, and FIG. 8B is a schematic perspective diagram illustrating an enclosing member in which a slit opening is formed on a side surface thereof.

As FIG. 8A illustrates, a window opening 510 is formed in a side surface of the enclosing member 500. The opening 510 may have a rectangular shape, for example. At least one dimension of the opening 510 in the longitudinal direction or the lateral direction may be equal to or less than 20 μm, for example. Note that, the shape of the window opening 510 is not limited to a rectangular shape. The window opening 510 may also have an elliptical shape, for example, with its largest diameter equal to or less than 20 μm.

Further, as FIG. 8B illustrates, a slit opening (cutout) 520 is formed in a side surface of the enclosing member 500. The width of the opening 520 may be equal to or less than 20 μm, for example. The width of the opening 520 is equal to or less than the size (equal to or less than the diameter) of one solder particle when using solder paste.

According to the fourth embodiment described above, the opening 510 or the opening 520 is formed in the side surface of the enclosing member 500, and therefore the volatile flux constituent emitted when the solder paste is melted can be discharged, along with air remaining with the solder paste. Voids remaining in inner portions of the solder connection parts after melting can thus be reduced, and the connection reliability can be increased. Note that, effects similar to those of the fourth embodiment may be achieved by using a material having porosity for the enclosing members 500, that is, by forming the enclosing members 500 by using a porous material.

Example of Execution

In this example, two configurations of the first embodiment illustrated in FIG. 1 are presented, one in which the enclosing members 500 are used, and one in which the enclosing members are not used. The amount of alloy within the solder that flows out in each case is compared, and the effectiveness of reducing the occurrence of solder bridging is confirmed. Specific dimensions are provided below.

First, a case where the enclosing members 500 are not disposed is described based on a related-art mounting structure.

Figure 10:
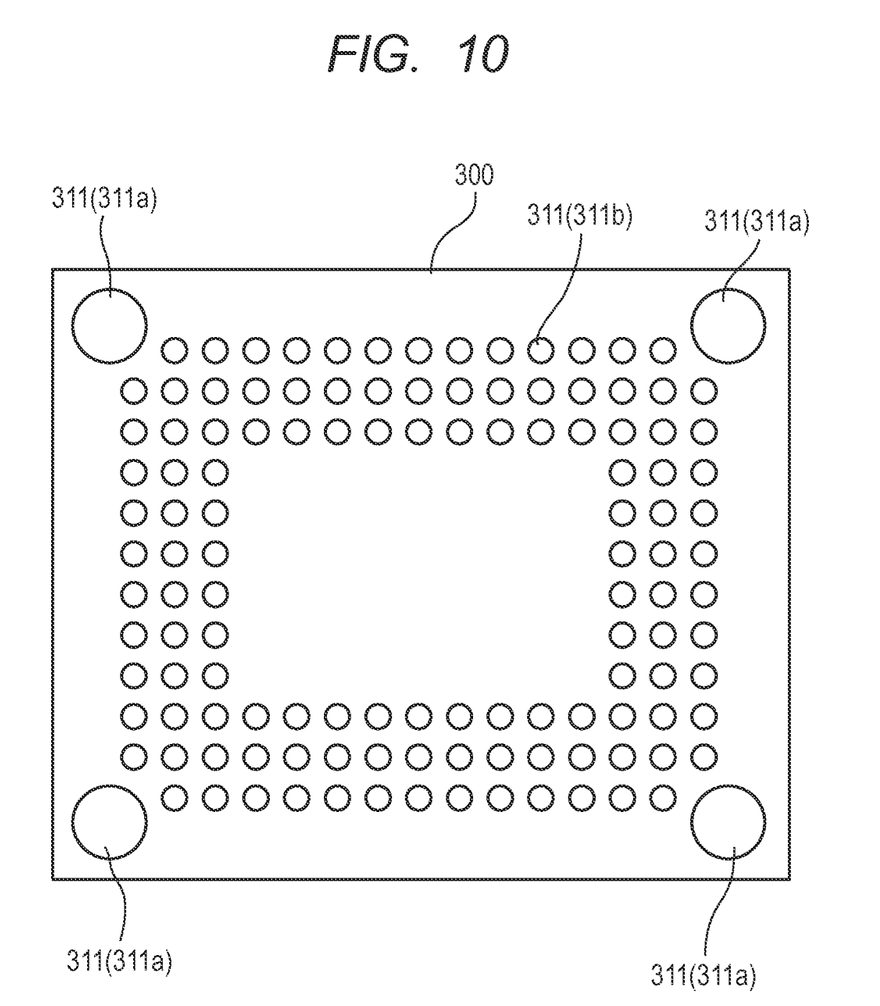
FIG. 10 is a schematic plan view illustrating electrode arrangement on a printed wiring board according to a comparative example.

FIG. 10 is a schematic plan view illustrating electrode arrangement on a printed wiring board according to a comparative example. As FIG. 10 illustrates, a sample of the printed wiring board 300 has a rectangular shape with outer dimensions of 32.0 mm×30.0 mm and a thickness of 1.4 mm. The circular electrode pads 311 corresponding to openings of a solder resist layer, which each have a diameter of 1.2 mm, are formed at a pitch of 2 mm and arranged in three columns in a peripheral state. The reinforcing electrode pads 311a corresponding to openings of a solder resist layer, which each have a diameter of 3.5 mm, are formed in the four corner portions. Solder paste is printed on the electrode pads 311 of the printed wiring board 300 sample using stainless steel printing plate. The printing plate thickness used is 0.35 mm, the diameter of the circular solder pastes outside of the four corner portions is 1.2 mm, and the diameter of the circular solder pastes in the four corner portions is 3.5 mm. The composition of the solder in the solder pastes is 42.0% tin and 58.0% bismuth by weight.

The semiconductor package 200 sample as an electronic component has a rectangular shape with outer dimensions of 32.0 mm×30.0 mm and a thickness of 2 mm. The circular electrode pads corresponding to openings of a solder resist layer, which each have a diameter of 1.2 mm, are formed at a pitch of 2 mm and arranged in three columns in a peripheral state at locations opposing the electrode pads 311 of the printed wiring board 300. Further, electrode pads corresponding to openings of the solder resist layer, which each have a diameter of 3.6 mm, are formed in the four corner portions.

The semiconductor package 200 is mounted on the printed wiring board 300 having printed solder pastes so that respective electrode pads opposes one another. The flowing out of the solder pastes, while heat is applied, is then observed using a transmission X-ray observation instrument.

Figure 11A:
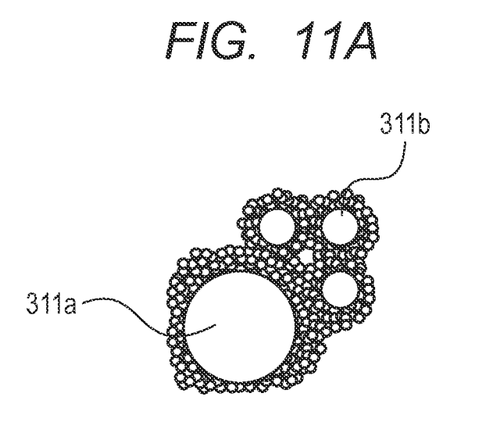
FIG. 11A is a schematic diagram of an X-ray image image representing solder spread in the comparative example.
Figure 11B:
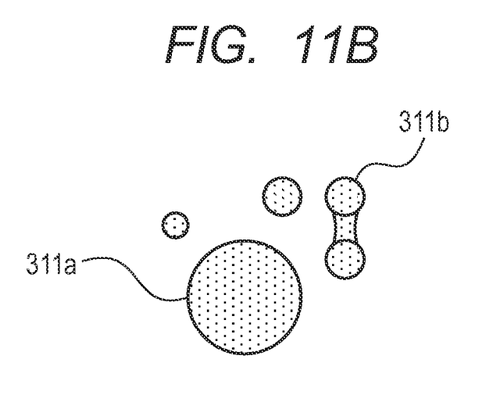
FIG. 11B is a schematic diagram of an X-ray image representing solder spread in the comparative example.

FIG. 11A and FIG. 11B are schematic diagrams of X-ray images representing solder spread in the comparative example. FIG. 11A is a schematic diagram of an X-ray image representing solder spread at approximately 120° C., and FIG. 11B is a schematic diagram of an X-ray image representing solder spread at approximately 150° C.

As FIG. 11A illustrates, when the mounted structure of the comparative example is heated, the solder paste area of the four corner portions increases up to approximately 2.49 times larger when heated up to approximately 120° C., and the solder paste is brought into contact with adjacent terminals. As FIG. 11B illustrates, when heating is further performed up to approximately 150° C., the solder pastes melt and are unable to completely return to their former shape when agglomerating due to their own surface tension. Solder bridges thus develops. In addition, the solder is split after the solder pastes melting and agglomerating due to their own surface tension. The solder is also seen scattered in an external portion as solder balls.

Hereinafter, a case where the enclosing members 500 are disposed is described as an example. The configuration of FIG. 7 described by the third embodiment above is used as the example.

A similar sample and experiments similar to those based on the comparative example above are used, along with similar procedures. After proceeding to the stage of printing the solder paste, as FIG. 7 illustrates, the enclosing members 500 are disposed in locations enclosing the solder pastes at the four corner portions. The enclosing members 500 are made of stainless steel and are cylindrical in shape, having a circular opening portion with diameter of 3.6 mm, an outer diameter of 4.6 mm, and a thickness of 0.2 mm.

Figure 9A:
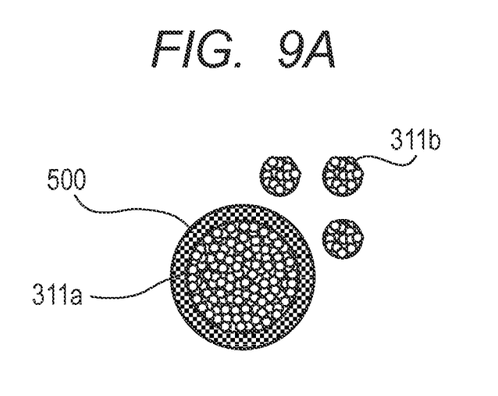
FIG. 9A is a schematic diagram of an X-ray image representing solder spread in an example.
Figure 9B:
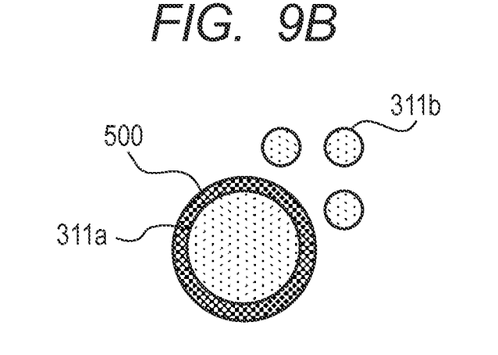
FIG. 9B is a schematic diagram of an X-ray image representing solder spread in the example.

FIG. 9A and FIG. 9B are schematic diagrams of X-ray images representing solder spread in the example. FIG. 9A is a schematic diagram of an X-ray image representing solder spread at approximately 120° C., and FIG. 9B is a schematic diagram of an X-ray image representing solder spread at approximately 150° C.

As FIG. 9A illustrates, when the structure of this example is heated, the solder pastes in the four corner portions are dammed by the enclosing members 500 even when heated up to approximately 120° C. and does not spread out to contact adjacent terminals. Further, as FIG. 9B illustrates, even after the solder pastes melt after heating to approximately 150° C., the solder pastes in the four corner portions does not spread out to contact adjacent terminals. In addition, when the solder pastes agglomerate under their own surface tension after melting, the solder does not split, and there are no solder balls seen scattered in an external portion.

Note that, the present invention is not limited to the embodiments described above, and it is possible for a person having ordinary skill in the art to make various changes within the technical scope of the present invention.

The embodiments are described using a connection structure between a package substrate of a semiconductor package and a printed wiring board in a printed circuit board, but the present invention is not limited to this configuration. For example, it is also possible to apply the present invention to a connection structure between a package substrate of a first semiconductor package (first semiconductor device) and a package substrate of a second semiconductor package (second semiconductor device) in a stacked semiconductor device. Further, it is also possible to apply the present invention to a connection structure between a printed wiring board (first semiconductor device) and a printed wiring board (second semiconductor device).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-129410, filed Jun. 20, 2013, which is hereby incorporated by reference herein in its entirety.

What is claimed is:
1. A printed circuit board, comprising:
a semiconductor package having:
a package substrate having a plurality of first electrode pads arranged on one surface of the semiconductor package, the plurality of first electrode pads includes at least one first reinforcing electrode pad having a surface area larger than a surface area of each of the other first electrode pads; and
a semiconductor element mounted on the package substrate;
a printed wiring board having a plurality of second electrode pads that is arranged opposing each of the first electrode pads, the semiconductor package is mounted on the printed wiring board and the plurality of second electrode pads includes at least one second reinforcing electrode pad being disposed in a location opposing the at least one first reinforcing electrode pad and having a surface area larger than a surface area of each of the other second electrode pads;
a plurality of solder connection parts being configured to connect the plurality of first electrode pads and the plurality of second electrode pads, the plurality of solder connection parts includes a plurality of first solder connection parts and a second solder connection part being configured to connect the at least one first reinforcing electrode pad and the at least one second reinforcing electrode pad; and a cylindrical enclosing member being configured to enclose an outer perimeter of the second solder connection part,
wherein the cylindrical enclosing member is formed using a porous member.

2. A printed circuit board according to claim 1, wherein the cylindrical enclosing member has a melting point higher than a melting point of solder used in the plurality of solder connection parts, and the cylindrical enclosing member is prevented from being directly fixed to the package substrate and to the printed wiring board.

3. A printed circuit board according to claim 1,
wherein the plurality of solder connecting parts is arranged in matrix, and
wherein the second solder connection part is disposed in an outer perimeter of the plurality of solder connection parts arranged in matrix.

4. A printed circuit board according to claim 3, wherein the second solder connection part is disposed in each of four corner portions of the plurality of solder connection parts arranged in matrix.

5. A printed circuit board according to claim 3, wherein the second solder connection part is disposed in each of four corner portions and location other than the four corner portions of the plurality of solder connection parts arranged in matrix.

6. A printed circuit board according to claim 1,
wherein the first solder connection parts, from among the plurality of solder connection parts, are arranged in matrix, and
wherein the second solder connection part is disposed further to an outer perimeter portion than the first solder connection parts arranged in matrix.

7. A printed circuit board according to claim 6, wherein the second solder connecting part is disposed in each of four corner portions of the package substrate, which are located further to the outer perimeter portion than the first solder connection parts arranged in matrix.

8. A printed circuit board according to claim 1, wherein the cylindrical enclosing member has one of an opening and a slit with a width equal to or less than 20 μm.

9. A printed circuit board according to claim 1, wherein the semiconductor package corresponds to an LGA semiconductor package.

10. A semiconductor device connection structure, comprising:
a first semiconductor device having a plurality of first electrode pads arranged on one surface of the first semiconductor device, the plurality of first electrode pads including at least one first reinforcing electrode pad having a surface area larger than a surface area of each of other first electrode pads;
a second semiconductor device having a plurality of second electrode pads that is arranged opposing each of the first electrode pads, the plurality of second electrode pads includes at least one second reinforcing electrode pad being disposed in a location opposing the at least one first reinforcing electrode pad and having a surface area larger than a surface area of each of the other second electrode pads;
a plurality of solder connection parts being configured to connect the plurality of first electrode pads and the plurality of second electrode pads, the plurality of solder connection parts includes a plurality of first solder connection parts and a second solder connection part being configured to connect the at least one first reinforcing electrode pad and the at least one second reinforcing electrode pad; and
a cylindrical enclosing member being configured to enclose an outer perimeter of the second solder connection part,
wherein the cylindrical enclosing member is formed using a porous member.

* * * * *